United States Patent
Rezeanu et al.

(10) Patent No.: US 6,510,483 B1
(45) Date of Patent: Jan. 21, 2003

(54) CIRCUIT, ARCHITECTURE AND METHOD FOR READING AN ADDRESS COUNTER AND/OR MATCHING A BUS WIDTH THROUGH ONE OR MORE SYNCHRONOUS PORTS

(75) Inventors: Stefan-Cristian Rezeanu, Colorado Springs, CO (US); James Allan, Colorado Springs, CO (US); Emad Hamadeh, Santa Clara, CA (US); Eric Gross, Monument, CO (US); Vijay Srinivasaraghavan, Colorado Springs, CO (US); Robert Manning, Monument, CO (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/531,365

(22) Filed: Mar. 21, 2000

(51) Int. Cl.$^7$ .......................... G06F 13/40; G06F 3/00; G06F 1/04; G11C 7/00
(52) U.S. Cl. .......................... 710/307; 710/51; 710/52; 711/211; 365/189.02; 365/230.02; 713/600
(58) Field of Search .......................... 710/307, 51, 52; 711/211; 365/189.02, 230.02; 713/600

(56) References Cited

U.S. PATENT DOCUMENTS

| | | | | |
|---|---|---|---|---|
| 5,548,786 A | * | 8/1996 | Amini et al. | 710/22 |
| 5,590,287 A | * | 12/1996 | Zeller et al. | 703/26 |
| 6,044,412 A | * | 3/2000 | Evoy | 710/14 |

* cited by examiner

Primary Examiner—Peter Wong
Assistant Examiner—Trisha Vu
(74) Attorney, Agent, or Firm—Christopher P. Maiorana, P.C.

(57) ABSTRACT

An apparatus comprising a first circuit, a second circuit, and a third circuit. The first circuit may be configured to select (i) a read-back address signal or (ii) a data signal as an output signal in response to one or more first control signals. The second circuit may be configured to generate (i) the read-back address signal and (ii) a cycle identification signal in response to an internal address signal and one or more second control signals. The third circuit may be configured to generate one or more I/O control signals in response to the cycle identification signal, where the one or more I/O control signals may determine the format of the output signal.

22 Claims, 5 Drawing Sheets

CIRCUIT, ARCHITECTURE AND METHOD FOR READING AN ADDRESS COUNTER AND/OR MATCHING A BUS WIDTH THROUGH ONE OR MORE SYNCHRONOUS PORTS

CROSS REFERENCE TO RELATED APPLICATIONS

The present application may relate to co-pending application Ser. No. 09/531,341, filed concurrently, which is hereby incorporated by reference in its entirety.

FIELD OF THE INVENTION

The present invention relates to memory devices generally and, more particularly, to a circuit, architecture and method for reading an address counter and/or matching a bus width through one or more synchronous ports.

BACKGROUND OF THE INVENTION

Multi-port memory devices are used in many different applications to communicate and share data between two or more systems. When two or more of the systems have buses of different size, some method of bus matching must be employed. One conventional approach is to use some form of external logic. Memory devices with external bus matching capability can, in a particular example, transfer four "bytes" (9 bits/"byte") of data in the standard x36 format (e.g., "long-word") as well as x18 (e.g., "word") and x9 (e.g., "byte") formats.

SUMMARY OF THE INVENTION

The present invention concerns an apparatus comprising a first circuit, a second circuit, and a third circuit. The first circuit may be configured to select (i) a counter address signal (to be read back), (ii) a first data signal (e.g., pipelined), or (iii) a second data signal (e.g., flow-through) as an output signal in response to one or more first control signal(s). The second circuit may be configured to generate (i) the counter address signal and (ii) a cycle identification signal in response to an internal address signal and one or more second control signal(s). The third circuit may be configured to generate one or more I/O control signal(s) in response to the cycle identification signal, one or more bus matching format control signal(s), and one or more counter read-back control signal(s). The one or more I/O control signal(s) may determine the format of the output signal.

The objects, features and advantages of the present invention include providing a circuit, architecture, and method for reading an address counter and/or matching a bus width through one or more synchronous ports that may: (i) place internal address information on the I/O lines of a memory device in the same manner as data from the memory array; (ii) use the I/O multiplexer buffer to select between address information, flow-through data, and pipelined data; (iii) output the internal address information using one or two clock cycles depending on the user-controlled external I/O bus format as set by bus-matching specific external signals; (iv) internally control the number of cycles and specific multiplexing scheme for outputting internal address information; and/or (v) register the internal address information and then read the information out in subsequent clock cycles, depending on the bus-matching format and/or the active synchronous operation mode (e.g., flow-through or pipelined).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may implement a memory device with an address counter/register read-back capability. The present invention may be implemented in a memory device. For synchronous testing purposes, an address counter/register read-back capability may also be incorporated into an asynchronous memory device. Such a read-back capability may need to be compatible with the particular bus matching mode in which the memory device is operating.

Figure 1:
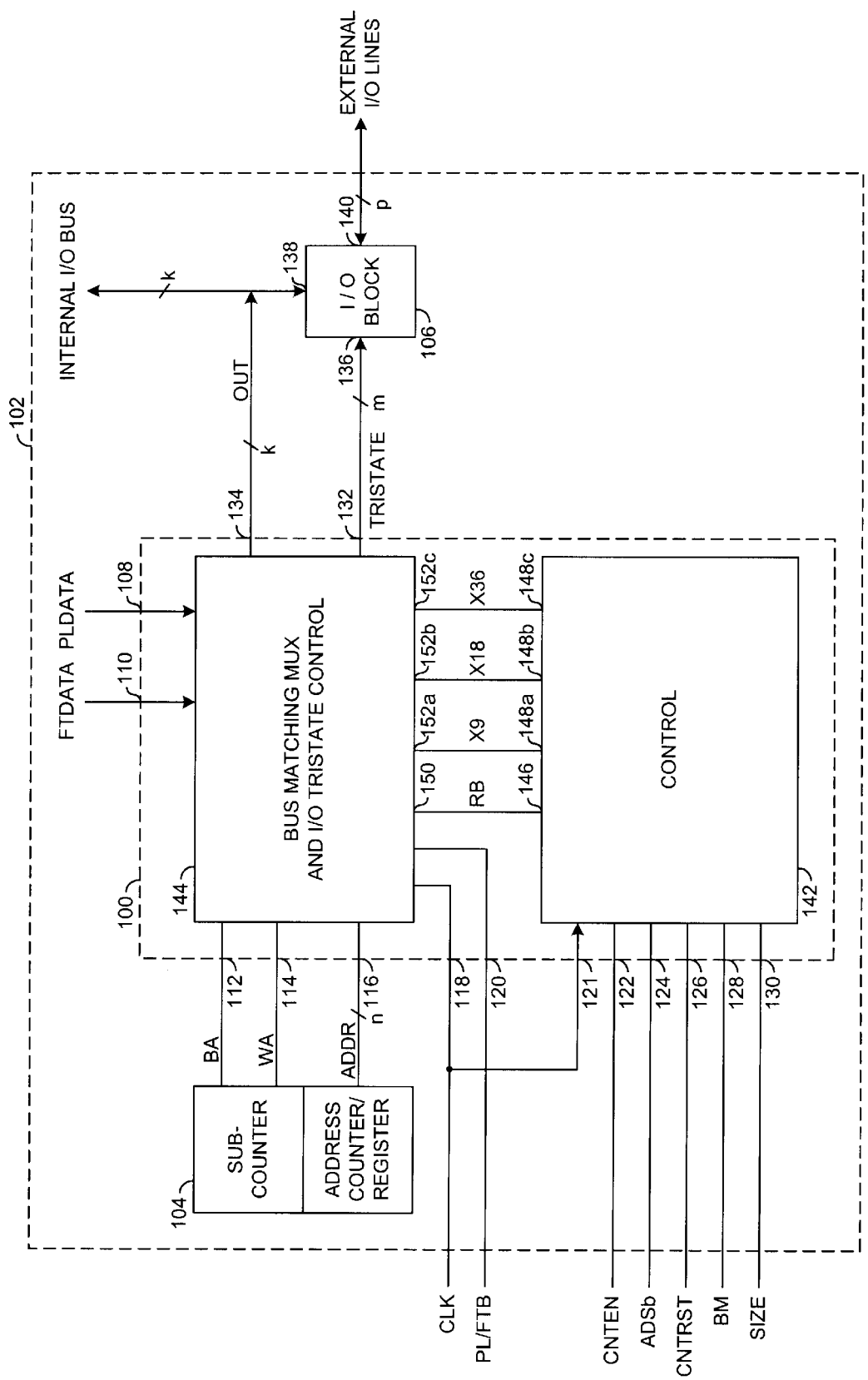
FIG. 1 is a block diagram of an overall architecture of a preferred embodiment of the present invention.

Referring to FIG. 1, a block diagram of a circuit 100 is shown in accordance with a preferred embodiment of the present invention. In one example, the circuit 100 may be a bus matching multiplexer/control circuit. The circuit 100 is generally implemented as a component of a memory control sub-circuit 102. The memory control sub-circuit 102 may be configured to provide internal address read-back and/or bus matching capability. In one example, the memory control sub-circuit 102 may be part of a one megabyte SRAM internally configured as a x36 memory. However, other sizes and widths of memory devices may be implemented to meet the design criteria of a particular implementation. The memory control sub-circuit 102 may also comprise a circuit 104 and a circuit 106. In one example, the circuit 104 may comprise a sub-counter and an address counter register. In one example, the circuit 106 may be an I/O circuit.

The circuit 100 may have (i) an input 108 that may receive a pipeline data signal (e.g., PLDATA), (ii) an input 110 that may receive a flow-through data signal (e.g., FTDATA), (iii) an input 112 that may receive a bus-matching specific internal address signal (e.g., BA), (iv) an input 114 that may receive another bus-matching specific internal address signal (e.g., WA) and (v) an input 116 that may receive another internal address signal (e.g., ADDR). The circuit 100 may also have (i) an input 118 that may receive a clock signal (e.g., CLK), (ii) an input 120 that may receive a control signal (e.g., PL/FTb), (iii) an input 122 that may receive an enable signal (e.g., CNTEN), (iv) an input 124 that may receive an address specific control signal (e.g., ADSb), (v) an input 126 that may receive a reset signal (e.g., CNTRST), (vi) an input 128 that may receive a bus-matching specific control signal (e.g., BM), and (vii) an input 130 that may receive another bus-matching specific control signal (e.g., SIZE). In one example, the input 116 and the signal ADDR may be n-bits wide, where n is an integer.

The circuit 100 may have an output 132 that may generate a control signal (e.g., TRISTATE) and an output 134 that may generate an output signal (e.g., OUT). The signals TRISTATE and OUT may be generated in response to one or more of the signals PLDATA, FTDATA, BA, WA, ADDR, CLK, PL/FTb, CNTEN, ADSb, CNTRST, BM and SIZE. In one example, the signal TRISTATE may be m-bits wide, and the signal OUT may be k-bits wide, where m and k are integers. The signal TRISTATE may comprise one tristate line for I/O 27–35 and one tristate line for I/O 18–26, where both tristate lines may be active during a counter read-back.

The signal TRISTATE may also comprise one tristate line for the upper byte (e.g., I/O 9–17) in a x18 (word) format, where the tristate line is active for a counter read-back in a x9 mode. I/O 2 is generally disabled (tristated) for a counter read-back in a x36 mode, and I/O 1 is generally disabled for a counter read-back in a x36 or a x18 mode. I/O 0 may be enabled if either (i) counter read-back is not active or (ii) counter read-back is active for a x9 mode during either the first or the second counter readout cycle.

The circuit 104 may be configured to present the signals BA, WA and ADDR to the circuit 100. The circuit 106 may have an input 136 that may receive the signal TRISTATE. The signal TRISTATE may indicate the external format to which the internal x36 address data is to be matched. The circuit 106 is generally connected to an internal input/output bus at an input/output 138. The circuit 106 is generally connected to a plurality of external input/output lines at an input/output 140. The signal OUT is generally presented to the internal input/output bus. The input 136 and the input/output 138 may be m-bits and k-bits wide respectively. The input/output 140 may generally be k-bits wide, where "p" of the "k" lines are generally active, depending on the state of the TRISTATE lines, where p is an integer. The signal OUT may contain the internal address data to be read out. The circuit 106 may receive the signal OUT on the internal I/O bus and present the internal address data to the specific output pins designated by the signal TRISTATE, in one or more clock cycles, depending on the particular bus-matching format selected.

The circuit 100 generally comprises a circuit 142 and a circuit 144. In one example, the circuit 142 may be a control circuit and the circuit 144 may be a bus matching multiplexer and I/O tristate control circuit. The circuit 142 may have an output 146 that may generate a read-back control signal (e.g., RB) in response to one or more of the signals CNTEN, ADSb, CNTRST, BM and SIZE. The circuit 142 may, in one example, have an output 148a that generates a bus-matching format control signal (e.g., x9), an output 148b that generates another bus-matching format control signal (e.g., x18), and an output 148c that generates yet another bus-matching format control signal (e.g., x36). However, additional outputs (e.g., 148d–148l) and additional signals (e.g., x72–xq) may be implemented accordingly to meet the design criteria of a particular application. The circuit 142 may generate the signals x9–xq in response to one or more of the signals CNTEN, ADSb, CNTRST, BM and SIZE (e.g., SIZEl–SIZEt).

The circuit 144 may have an input 150 that may receive the read-back control signal RB. The circuit 144 may, in one example, have an input 152a that may receive the signal x9, an input 152b that may receive the signal x18 and an input 152c that may receive the signal x36. Additional inputs (e.g., 152d–152l) may be implemented to meet the design criteria of a particular application. The circuit 144 may generate the signals TRISTATE and OUT in response to one or more of the signals PLDATA, FTDATA, BA, WA, ADDR, CLK, PL/FTb, RB, x9, x18 and x36. In one example, the signal PL/FTb may represent a read mode (e.g., either pipelined or flow through). For the pipelined mode, there are generally two options, (i) read-back address data first (then the memory output data which is stored for pipelined access in an output register) or (ii) data from the previous cycle may be presented first, and then the counter read-back data (in one or two cycles). The signal PL/FTb is generally fed into the I/O routing and tristate control logic (to be described in more detail in connection with FIG. 2), either directly, or after being combined with one or more other control signals in a preceding control block. One or more no-op cycle(s) are generally required for x9 in the alternate embodiment (to be described in more detail in connection with FIG. 5).

Figure 2:
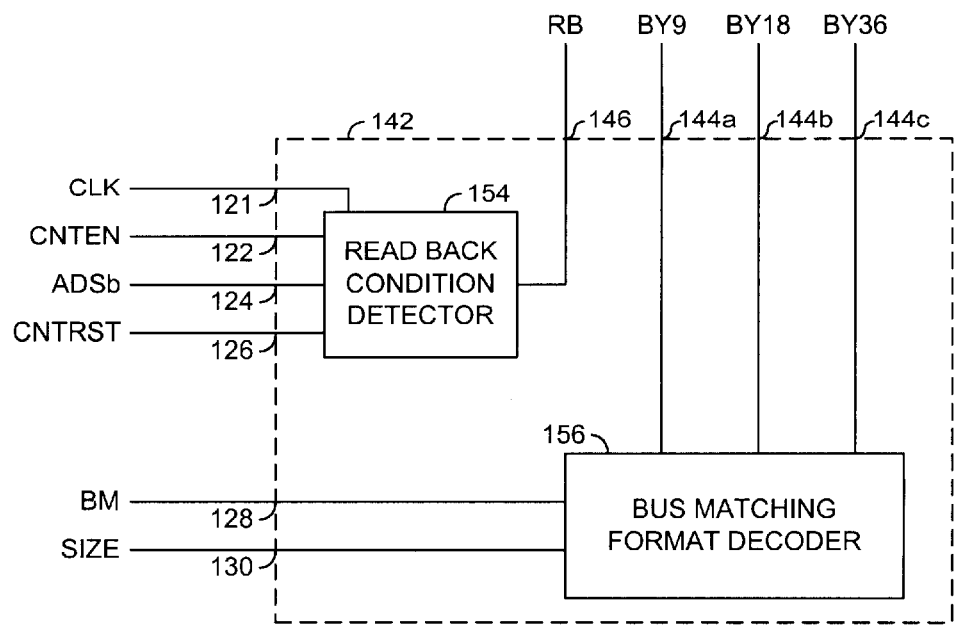
FIG. 2 is a block diagram of the control circuit of FIG. 1.

Referring to FIG. 2, a more detailed block diagram of the circuit 142 is shown. The circuit 142 generally comprises a circuit 154 and a circuit 156. In one example, the circuit 154 may be a read-back condition detector and the circuit 156 may be a bus matching format decoder. The circuit 154 may be configured to generate the signal RB in response to the signals CNTEN, ADSb, and CNTRST. The signal RB may be implemented to synchronously or asynchronously indicate when the internal address data is to be read-back. The read-back condition is generally CNTEN=0 (inactive), ADSb=0 (active) and CNTRST=0 (inactive). Implementing an "unusual" combination of the CNTEN, ADSb and CNTRST pins may indicate the read-back condition, avoiding the use of a separate read-back pin. The combination, CNTEN=1, ADSb=0 and CNTRST=0 may indicate a parallel load of the external address in the main counter. The circuit 156 may be configured to generate the signals x9, x18 and x36 in response to the signals BM and SIZE. The signals x9, x18 and x36 may represent a decoded bus matching format signal implemented to indicate the external I/O bus format to which the internal data bus is to be matched.

Figure 3:
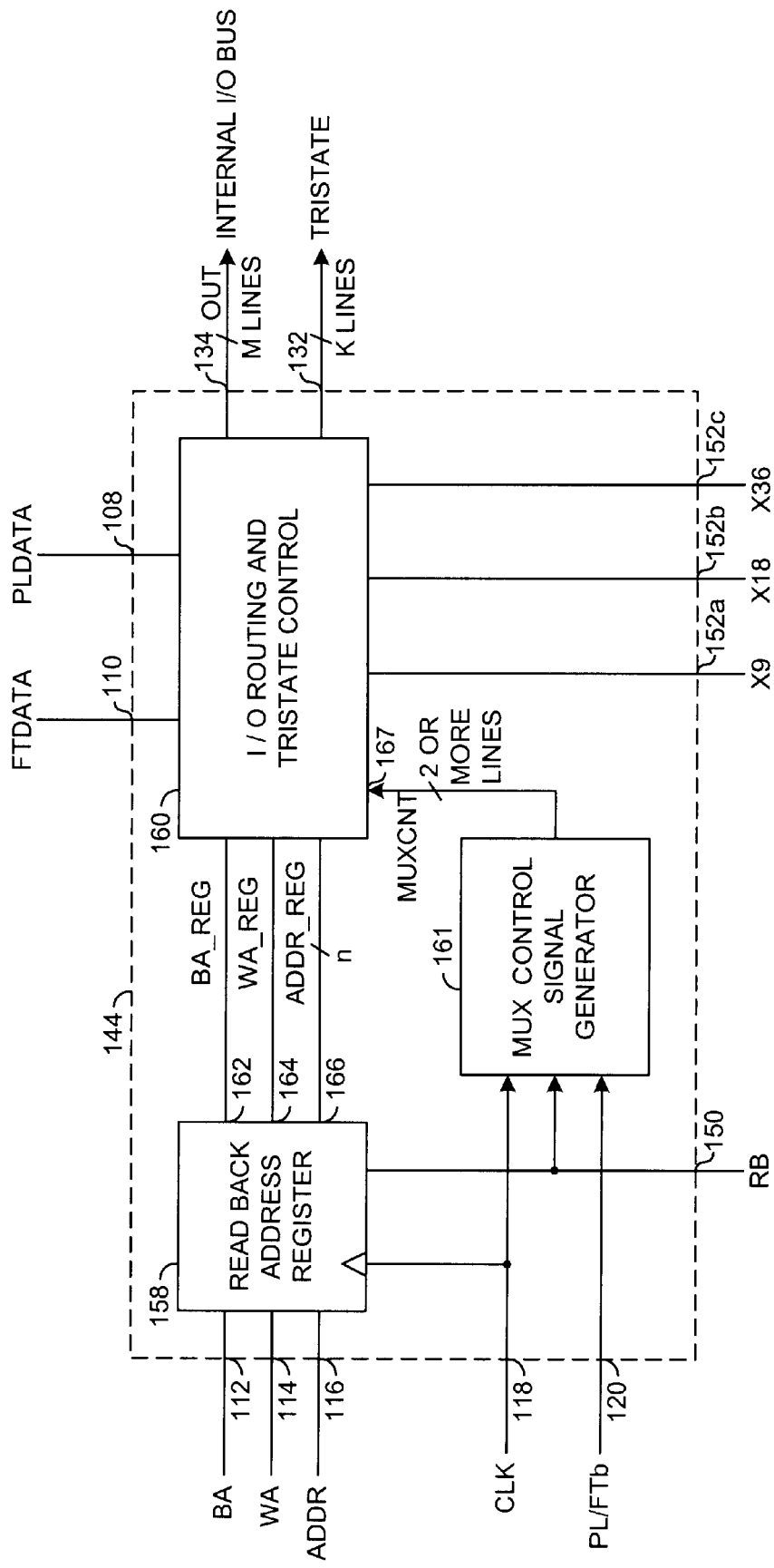
FIG. 3 is a more detailed block diagram illustrating the bus matching multiplexer and I/O tristate control of FIG. 1.

Referring to FIG. 3, a more detailed block diagram of the circuit 144 is shown. The circuit 144 generally comprises a circuit 158, a circuit 160 and a circuit 161. In one example, the circuit 158 may be a read-back address register and the circuit 160 may be an input/output routing and tristate control block. The circuit 161 may, in one example, be a multiplexer control signal generator.

When the read-back condition is synchronously detected (e.g., the signal RB goes high), the signal BA, the signal WA and the signal ADDR may be registered in the circuit 158 and presented to the circuit 160. The circuit 158 may have an output 162 that may present a signal BA_REG, an output 164 that may present a signal WA_REG and an output 166 that may present a signal ADDR_REG. The signal ADDR_REG and the output 166 may be n-bits wide, where n is an integer. The signals BA_REG, WA_REG and ADDR_REG may be generated in response to one or more of the signals BA, WA, ADDR, CLK and RB. In the example of a 1 Meg by 36 SRAM (e.g., n=15), the number of bits read back by combining the signals ADDR_REG, and/or BA_REG, and/or WA_REG may be (i) n=15-bits read back in one clock cycle if bus matching is not active, (ii) n+1 (WA_REG)=16-bits read back in one clock cycle if bus matching with an external I/O format of x18 was chosen or (iii) n+2 (WA_REG, BA_REG)=17-bits read back in two clock cycles if bus matching with an external I/O format of x9 was chosen.

The circuit 160 may generate the signals OUT and TRISTATE in response to one or more of the signals PLDATA, FTDATA, BA_REG, WA_REG, ADDR_REG, PL/FTb, x9, x18, x36 and a control signal (e.g., MUXCNT). The circuit 161 may generate the signal MUXCNT in response to one or more of the signals CLK, PL/FTb and RB. The signal MUXCNT may be 2 or more lines wide, where one of the lines generally comprises a registered or not, synchronous or not, counter read control signal (e.g., CNTRD).

Figure 4:
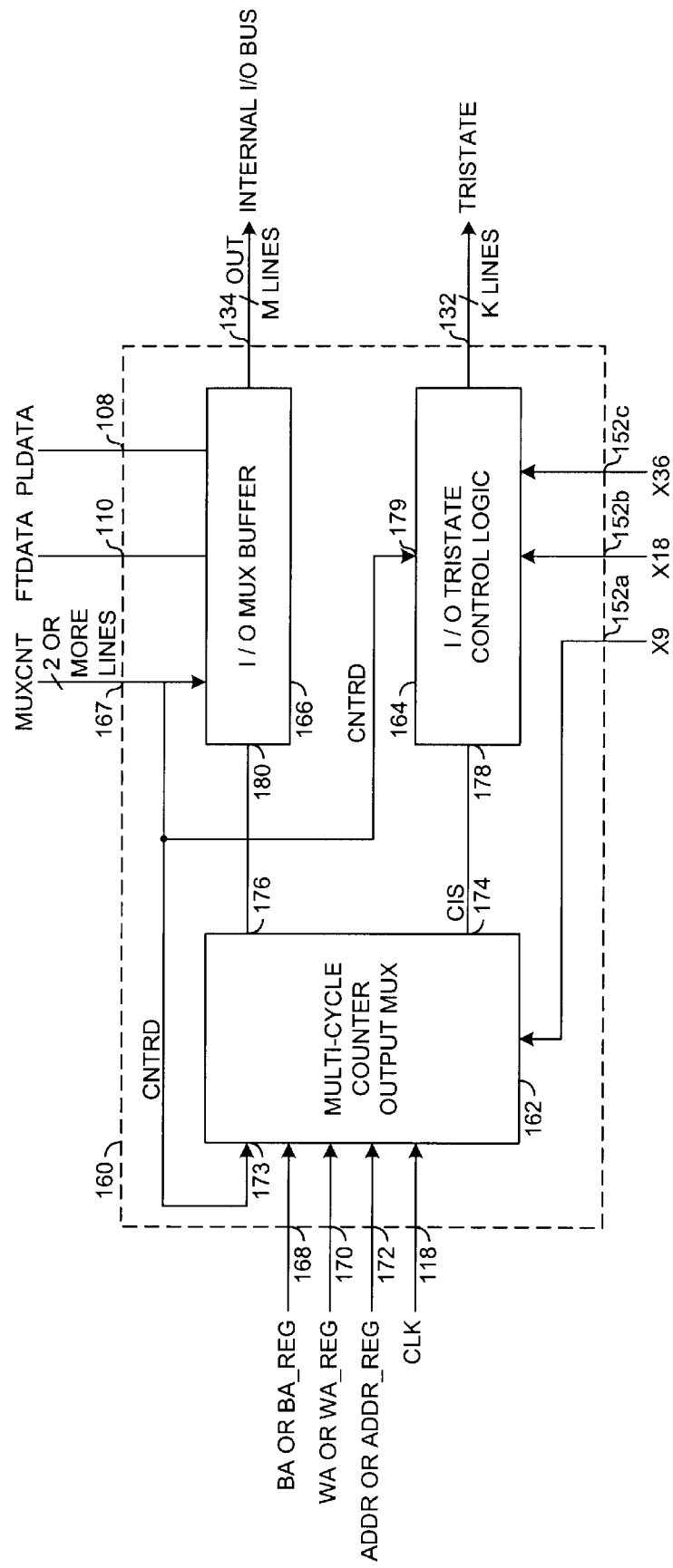
FIG. 4 is a more detailed block diagram illustrating the I/O routing and tristate control circuit of FIG. 3.

Referring to FIG. 4, a more detailed block diagram of the circuit 160 is shown. The circuit 160 generally comprises a circuit 162, a circuit 164 and a circuit 166. In one example, the circuit 162 may be a multi-cycle counter output multiplexer, the circuit 164 may be an I/O tristate control logic circuit, and the circuit 166 may be an input/output multiplexer buffer. The circuit 162 may have (i) an input 168 that may receive the internal byte address signal registered or not (e.g., BA or BA_REG), (ii) an input 170 that may receive the internal word address signal, registered or not (e.g., WA or WA_REG), (iii) an input 172 that may receive the internal address signal necessary to manipulate "long words" (e.g., ADDR or ADDR_REG) also registered or not, and/or (iv) an input 173 that may receive the signal CNTRD. The circuit 162 may have an output 174 that may generate a cycle identification signal (e.g., CIS) in response to the signals CLK, CNTRD, BA/BA_REG, WA/WA_REG, and ADDR/ADDR_REG. The signal CIS may indicate the number of clock cycles required for bus matching (e.g., 2 cycles for by9, in a particular application). The circuit 162 may have an output 176 that may generate a "to be read back" address signal (e.g., RDBACK) in response to the signals CLK, CNTRD, BA/BA_REG, WA/WA_REG, and ADDR/ADDR_REG. The signal RDBACK may contain the internal address data to be read back, made available on one or more clock cycles, depending on the bus matching format.

The circuit 164 may have an input 178 that may receive the signal CIS, an input 179 that may receive the signal CNTRD, and one or more bus matching format select signals (for the particular illustrated implementation, only 2 of the 3 bus matching format decoded signals x9, x18, and x36 have to be used; only a pair may be necessary; however, the pair may not necessarily be the bus matching format decoded signals x18 and x36 as shown in FIG. 4). The circuit 164 may generate the signal TRISTATE in response to the signals CIS and CNTRD. The signal TRISTATE may be implemented to indicate the external format to which the internal x36 data or address to be read back is to be matched, and may be activated for the number of cycles required for bus matching.

The circuit 166 may have (i) an input 108 that may receive the signal PLDATA, (ii) an input 110 that may receive the signal FTDATA, (iii) an input 180 that may receive the signal RDBACK, and (iv) an input 167 that may receive the signal MUXCNT. The circuit 166 may generate the signal OUT in response to the signals PLDATA, FTDATA, MUXCNT, and RDBACK. The circuit 166 may present the signal OUT to the internal I/O bus at the same location where the signal FTDATA or the signal PLDATA are presented during the normal read operation cycle. The signal OUT may contain the internal address data to be read out. If the signal OUT contains the internal address data, the circuit 106 may present the internal address data to the specific output pins designated by the signal TRISTATE.

Figure 5:
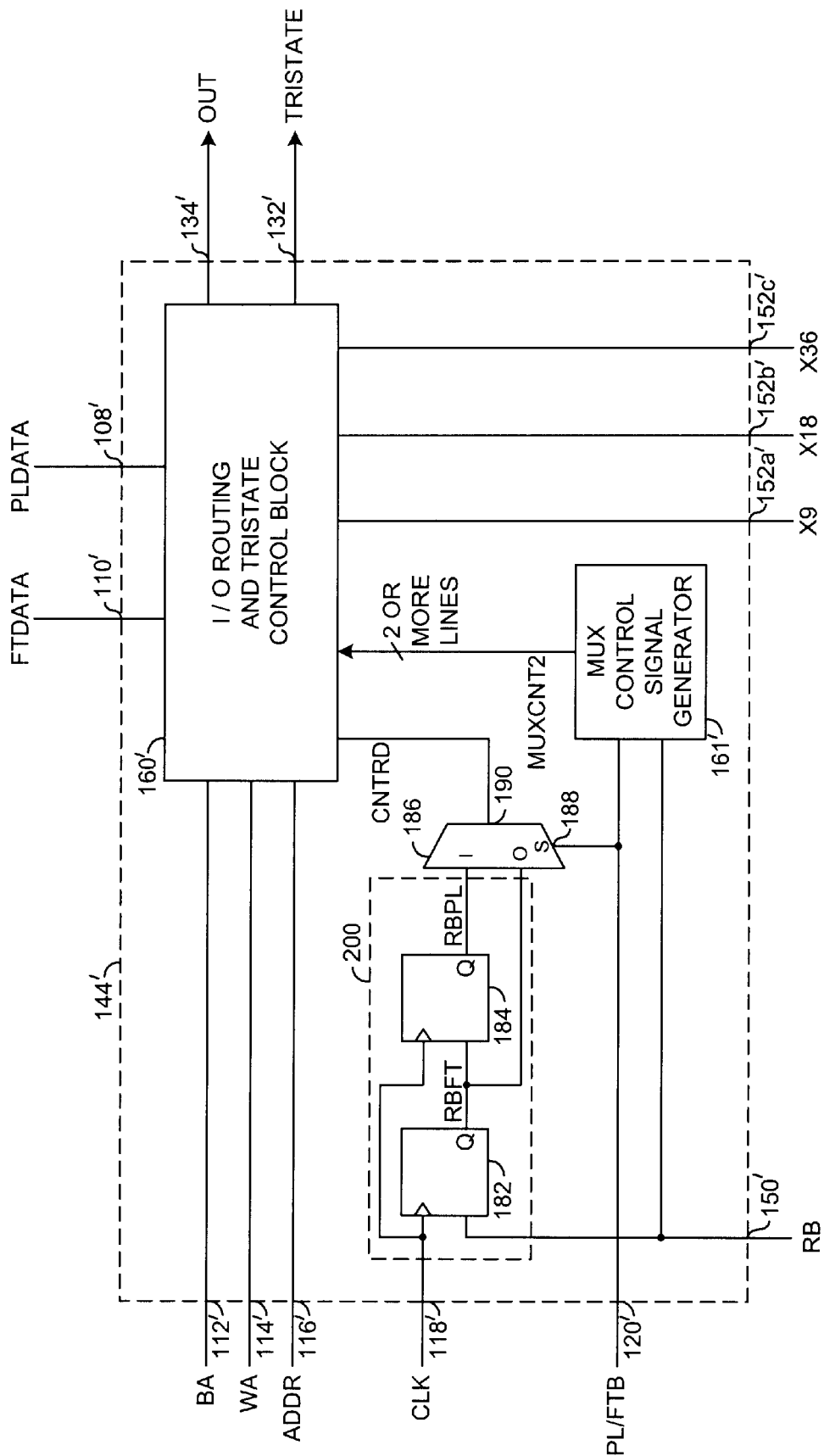
FIG. 5 is a block diagram illustrating an alternate construction of the bus matching multiplexer and I/O tristate control of FIG. 1.

Referring to FIG. 5, an alternate embodiment of the circuit 144' is shown. The main advantage of the alternate circuit 144' versus the circuit 144 is that the circuit 144' generally eliminates the need for a read-back address register 158. However, the circuit 144' may have the limitation of requiring one or more no-op cycles to complete the address read-back operation. The circuit 144' generally comprises a circuit 160', a circuit 200, a circuit 161' and a multiplexer 186. In one example, the circuit 160' may be an I/O routing and tristate control block. The circuit 200 may, in one example, be a pipelined and flow through read-back signal generator. In one example, the circuit 161' may be a multiplexer control signal generator, and the multiplexer 186 may be a 2 to 1 multiplexer. However, other types of multiplexers may be implemented to meet the design criteria of a specific application.

The circuit 200 may comprise, in one example, a flip-flop 182 and a flip-flop 184. In one example, the flip-flops 182 and 184 may be D-type flip-flops. However, other types of flip-flops/latches may be implemented to meet the design criteria of a specific application. The circuit 161' may be similar to the circuit 161, however, the circuit 161' generates a different control signal (e.g., MUXCNT2). The control signal MUXCNT2 is similar to the signal MUXCNT except that the signal MUXCNT2 does not generally include the signal CNTRD. In the embodiment of FIG. 5, the signal CNTRD is shown explicitly, generated by the multiplexer 186.

The flip-flop 182 may be configured to generate a control signal (e.g., RBFT) in response to the signals RB and CLK. In one example, the flip-flop 182 may be synchronous and therefore may only be set by the signal RB after a predetermined delay following the active transition of the CLK signal. This predetermined delay generally corresponds to the delay required for the flow through operation mode and may be one factor in determining the first clock cycle and/or the number of clock cycles required to read out the internal address information. The flip flop 182 may present the signal RBFT to the flip-flop 184 and to the multiplexer 186.

The flip-flop 184 may be configured to generate a control signal (e.g., RBPL) in response to the signals RBFT and CLK. The flip-flop 184 may be synchronous and therefore may only be set by the signal RBFT after a predetermined delay following the active transition of the CLK signal. The predetermined delay generally corresponds to the delay required for the pipelined operation mode and may be one factor in determining the first clock cycle and/or the number of clock cycles required to read out the internal address information.

The multiplexer 186 may receive the signal PL/FTb at a select input 188, the signal RBPL, and the signal RBFT. The multiplexer 186 may have an output 190 that may generate a counter read control signal (e.g., CNTRD) in response to the signals PL/FTb, RBPL and RBFT. The signal CNTRD may indicate the mode in which the counter address is to be read-back (e.g., either flow through or pipelined) and/or the number of clock cycles required to read-back the address in the specified mode.

The circuit 160' may receive the signals BA, WA, and ADDR, generally not registered (e.g., in place of the signals BA_REG, WA_REG, and ADDR_REG, respectively). In order to avoid overwriting the counter information expected to be read out in the first and/or second cycle, the circuit 160' may require one or more no-operation (e.g., a "counter hold") cycle(s) when a read-back is initiated for a x9 bus. Furthermore, the circuit 160' may have separate inputs for the signals CNTRD and MUXCNT2. In other respects, the circuits 160 and 160' may have a similar implementation. For example, the circuit 160' may generate the signals OUT and TRISTATE similarly to the way the circuit 160 may generate the signals OUT and TRISTATE. The circuit 161' may be configured to generate the signal MUXCNT2 in response to the signals PL/FTb and RB, and may or may not require the presence of the clock signal CLK.

Figure 6:
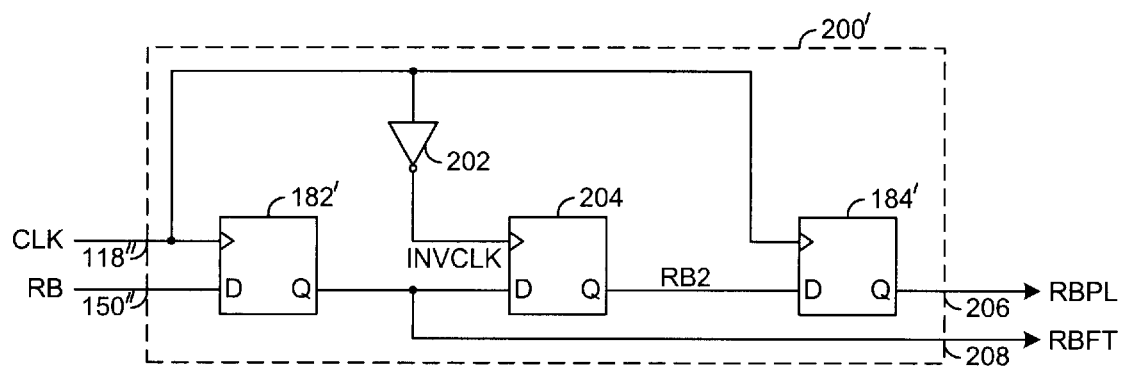
FIG. 6 is a alternate embodiment of a pipelined and flow-through read-back signal generator of FIG. 5.

Referring to FIG. 6, an alternate embodiment 200' of a circuit 200' is shown. In one example, the circuit 200' may be a pipelined and flow-through read-back signal generator. The circuit 200' may have an input 118" that may receive the signal CLK, and an input 150" that may receive the signal RB. The circuit 200' may have an output 206 that may generate the signal RBPL, and an output 208 that may generate the signal RBFT, both in response to the signals CLK and RB.

The circuit 200' generally comprises a flip-flop 182', a flip-flop 184', a flip-flop 204 and an inverter 202. In one example, the flip flops 182', 184', and 204 may be one or more D-type flip-flop(s), however, other types of flip-flops/latches may be implemented to meet the design criteria of a particular application.

The flip-flop 182' may be configured to generate the signal RBFT in response to the signals RB and CLK. In one example, the flip-flop 182' may be synchronous and therefore may only be set by the signal RB after a predetermined delay following the active transition of the CLK signal. The flip-flop 182' may present the signal RBFT to the circuit 204 and to the output 208. The inverter 202 may generate the signal INVCLK in response to the signal CLK. The inverter 202 may present the signal INVCLK to the flip-flop 204. The flip-flop 204 may be configured to generate a signal RB2 in response to the signals INVCLK and RBFT. In one example, the flip-flop 204 may be synchronous and therefore may only be set by the signal RBFT after a predetermined delay following the active transition of the INVCLK signal. The flip-flop 184' may be configured to generate the signal RBPL in response to the signal RB2 and the signal CLK. In one example, the flip-flop 184' may be synchronous and therefore may only be set by the signal RB2 after a predetermined delay following the active transition of the CLK signal.

The various signals are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation. For example, in the preceding particular illustrations, a signal whose name ends in "b" is considered asserted for a digital LOW.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to select (i) a read-back address signal, or (ii) a data signal as an output signal in response to one or more first control signals;
    a second circuit configured to generate (i) said read-back address signal and (ii) a cycle identification signal in response to an internal address signal and one or more second control signals;
    a third circuit configured to generate one or more I/O control signals in response to said cycle identification signal, wherein said one or more I/O control signals determine the format of said output signal.

2. The circuit according to claim 1, wherein said third circuit is configured to generate the one or more I/O control signals in further response to one or more bus matching format control signals, and one or more counter read-back control signals.

3. The apparatus according to claim 1, wherein said data signal is further selected in response to one or more first control signals between a first data signal and a second data signal.

4. The apparatus according to claim 1, wherein one of said first control signals comprises a read-back control signal.

5. The apparatus according to claim 4, wherein said read-back control signal is generated in response to a plurality of counter control signals.

6. The apparatus according to claim 5, wherein said plurality of counter control signals is selected from the group consisting of (i) an address strobe signal, (ii) a counter enable signal, and (iii) a counter reset signal.

7. The apparatus according to claim 1, wherein one of said one or more second control signals comprise bus matching format select signals.

8. The apparatus according to claim 7, wherein said bus matching format select signals are generated in response to one or more bus matching control signals.

9. The apparatus according to claim 3, wherein said first data signal represents a flow through active synchronous mode and said second data signal represents a pipelined active synchronous mode.

10. The apparatus according to claim 1, wherein said apparatus comprises a memory device.

11. The apparatus according to claim 10, wherein said memory device comprises a multi-port RAM.

12. The apparatus according to claim 10, wherein said memory device comprises an asynchronous RAM having a synchronous test mode.

13. The apparatus according to claim 1, wherein said second circuit internally controls:
    the number of cycles required to read out said read-back address signal; and
    multiplexing of said internal address signal.

14. An apparatus comprising:
    means for selecting (i) a read-back address signal, or (ii) a data signal as an output signal in response to one or more first control signals;
    means for generating (i) said read-back address signal and (ii) a cycle identification signal in response to an internal address signal and one or more second control signals;
    means for generating one or more I/O control signals in response to said cycle identification signal, wherein said one or more I/O control signals determine the format of said output signal.

15. The apparatus according to claim 14, wherein said means for generating said one or more control signals further responds to one or more bus matching format control signals, and one or more counter read-back control signals.

16. A method of reading the contents of an internal address counter/register of a memory device comprising the steps of:
    selecting (i) a read-back address signal, (ii) a first data signal or (iii) a second data signal as an output signal in response to one or more first control signals;
    generating (i) said read-back address signal and (ii) a cycle identification signal in response to an internal address signal and one or more second control signals;
    generating one or more I/O control signals in response to said cycle identification signal, one or more bus matching format control signals, and one or more counter read-back control signals, wherein said one or more I/O control signals determine the format of said output signal.

17. The method according to claim 16, wherein one of said first control signals comprise a read-back control signal.

18. The method according to claim 16, wherein said read-back control signal is generated in response to a plurality of counter control signals.

19. The method according to claim 18, wherein said plurality of counter control signals is selected from the group consisting of (i) an address strobe signal, (ii) a counter enable signal, and (iii) a counter reset signal.

20. The method according to claim 16, wherein said first data signal represents a flow through active synchronous mode and said second data signal represents a pipelined active synchronous mode.

21. The method according to claim 19, wherein said internal address data is read out in one or more subsequent clock cycles, depending on said bus matching format select signal and said active synchronous operation mode.

22. The method according to claim 20, wherein said internal address data is routed to an assigned output pin in response to said bus matching format select signals.

* * * * *